US012302731B2

(12) United States Patent
Kim et al.

(10) Patent No.: US 12,302,731 B2
(45) Date of Patent: *May 13, 2025

(54) DISPLAY DEVICE

(71) Applicant: Samsung Display Co., Ltd., Yongin-si (KR)

(72) Inventors: Soodong Kim, Hwaseong-si (KR); Sunyoung Kwon, Seoul (KR); Songyi Kim, Suwon-si (KR); Jinwon Kim, Suwon-si (KR); Kyoungwon Park, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 769 days.

This patent is subject to a terminal disclaimer.

(21) Appl. No.: 17/201,375

(22) Filed: Mar. 15, 2021

(65) Prior Publication Data

US 2021/0202590 A1    Jul. 1, 2021

Related U.S. Application Data

(63) Continuation of application No. 16/415,263, filed on May 17, 2019, now Pat. No. 10,964,759.

(30) Foreign Application Priority Data

Jun. 29, 2018 (KR) ........................ 10-2018-0075827

(51) Int. Cl.
*H10K 59/38* (2023.01)
*H10K 50/858* (2023.01)
*H10K 59/12* (2023.01)

(52) U.S. Cl.
CPC ........... *H10K 59/38* (2023.02); *H10K 50/858* (2023.02); *H10K 59/12* (2023.02)

(58) Field of Classification Search
CPC .... H01K 50/858; H01K 59/38; H01K 50/844; H01K 59/35; H01K 59/12; H10K 50/858;
(Continued)

(56) References Cited

U.S. PATENT DOCUMENTS 10,062,865 B2   8/2018  Lee et al.
10,355,055 B2   7/2019  Fujiwara et al.
(Continued)

FOREIGN PATENT DOCUMENTS

CN    107039492 A    8/2017
CN    107523016 A    1/2018
(Continued)

OTHER PUBLICATIONS

Extended European Search Report for corresponding European Patent Application No. 19182133.9, dated Nov. 4, 2019, 8 pages.
(Continued)

*Primary Examiner* — Thanhha S Pham
(74) *Attorney, Agent, or Firm* — Womble Bond Dickinson (US) LLP

(57) ABSTRACT

A display device includes a display element configured to generate a first color light, an encapsulation member on the display element and including an inorganic layer at an outermost portion thereof, a color conversion layer on the encapsulation member and including a first color conversion part configured to transmit the first color light, a second color conversion part configured to convert the first color light into a second color light, and a third color conversion part configured to convert the first color light into a third color light, and a buffer layer between the encapsulation member and the color conversion layer, wherein a difference in refractive index between the buffer layer and the inorganic layer is about 0.5 or less.

9 Claims, 13 Drawing Sheets

(58) Field of Classification Search
CPC ...... H10K 59/38; H10K 50/844; H10K 59/35; H10K 59/12; H10K 50/84; H10K 59/30; H10K 50/85
USPC .......................................................... 257/40
See application file for complete search history.

(56) References Cited

U.S. PATENT DOCUMENTS

| | | | |
|---|---|---|---|
| 10,361,259 B2 | 7/2019 | Choi et al. | |
| 10,964,759 B2 * | 3/2021 | Kim ....................... | H10K 59/38 |
| 2007/0200492 A1 | 8/2007 | Cok et al. | |
| 2009/0278454 A1 | 11/2009 | Fedorovskaya et al. | |
| 2012/0187394 A1 | 7/2012 | Hatano et al. | |
| 2015/0279912 A1 | 10/2015 | Negishi | |
| 2016/0041430 A1 | 2/2016 | Lee et al. | |
| 2016/0126496 A1 | 5/2016 | Wang et al. | |
| 2017/0076678 A1 | 3/2017 | Lee et al. | |
| 2017/0154930 A1 | 6/2017 | Kim et al. | |
| 2018/0101056 A1 | 4/2018 | Lee et al. | |
| 2018/0113570 A1 | 4/2018 | Kim et al. | |
| 2018/0122874 A1 | 5/2018 | Kim et al. | |
| 2018/0123071 A1 | 5/2018 | Kim et al. | |
| 2018/0143497 A1 | 5/2018 | Kim et al. | |
| 2018/0156951 A1 | 6/2018 | Baek et al. | |
| 2018/0219183 A1 | 8/2018 | Song | |
| 2018/0233689 A1 | 8/2018 | Kim et al. | |
| 2019/0064602 A1 | 2/2019 | Kim et al. | |
| 2019/0121176 A1 | 4/2019 | Lee et al. | |
| 2019/0165318 A1 | 5/2019 | Choi et al. | |
| 2019/0171063 A1 | 6/2019 | Lim | |
| 2019/0219875 A1 | 7/2019 | Jung et al. | |
| 2019/0284473 A1 | 9/2019 | Jain | |
| 2019/0293990 A1 | 9/2019 | Kwon et al. | |
| 2019/0296088 A1 | 9/2019 | Kim et al. | |

FOREIGN PATENT DOCUMENTS

| | | | | |
|---|---|---|---|---|
| CN | 107731868 A | | 2/2018 | |
| CN | 108153036 A | | 6/2018 | |
| CN | 113113446 A | * | 7/2021 | ........... H01K 50/865 |
| JP | 2006164618 A | * | 6/2006 | ............ H01L 27/32 |
| JP | 2006269226 A | * | 10/2006 | ............ H01L 51/50 |
| JP | 2015-128027 | * | 7/2015 | ............ H10K 59/38 |
| KR | 10-2017-0062904 A | | 6/2014 | |
| KR | 10-2016-0017373 A | | 2/2016 | |
| KR | 10-2017-0036160 A | | 4/2017 | |
| KR | 10-2017-0062707 A | | 6/2017 | |
| KR | 10-2017-0064164 A | | 6/2017 | |
| KR | 10-2018-0003967 A | | 1/2018 | |
| KR | 20180018969 | * | 2/2018 | |
| KR | 10-2018-0039218 A | | 4/2018 | |
| KR | 10-2018-0045974 A | | 5/2018 | |
| KR | 10-2018-0064616 A | | 6/2018 | |
| WO | 2015029425 A1 | * | 3/2015 | ........ H01L 27/14647 |
| WO | WO 2016/076169 A1 | | 5/2016 | |

OTHER PUBLICATIONS

Scholz, Bert J., et al.; Extraction of surface plasmons in organic light-emitting diodes via high-index coupling, Article, Optics Express, vol. 20, No. S2, Mar. 12, 2012, 8 pages.

Notice of Allowance for corresponding Korean patent application 10-2018-0075827 dated Aug. 28, 2021 (5 pages).

* cited by examiner

DISPLAY DEVICE

CROSS-REFERENCE TO RELATED APPLICATIONS

This application is a continuation of U.S. patent application Ser. No. 16/415,263, filed on May 17, 2019, which claims priority to and the benefit of Korean Patent Application No. 10-2018-0075827, filed on Jun. 29, 2018, the entire contents of which are hereby incorporated by reference.

BACKGROUND

The present disclosure herein relates to a display device. For example, embodiments of the present disclosure relate to a display device in which damage to a color conversion layer is minimized or reduced, and light extraction efficiency is improved.

Various display devices for use in multimedia devices such as televisions, mobile phones, navigation systems, computer monitors, game machines, and the like are being developed. In recent years, development of organic light emitting diodes and the like that are capable of being applied to large-sized display devices is being carried out.

In order to improve light efficiency of a display device and color reproducibility, application of a light emitting body such as quantum dots is increasing.

SUMMARY

Embodiments of the present disclosure provide a display device in which a buffer layer of which a refractive index is controlled is applied to improve light extraction efficiency.

An embodiment of the present disclosure provides a display device including: a display element configured to generate a first color light; an encapsulation member on the display element and including an inorganic layer at an outermost portion thereof; a color conversion layer on the encapsulation member and including a first color conversion part configured to transmit the first color light, a second color conversion part configured to convert the first color light into a second color light, and a third color conversion part configured to convert the first color light into a third color light; and a buffer layer between the encapsulation member and the color conversion layer, wherein a difference in refractive index between the buffer layer and the inorganic layer is about 0.5 or less.

In an embodiment, the buffer layer may be filled between the encapsulation member and the color conversion layer.

In an embodiment, the inorganic layer may have a refractive index of about 1.5 to about 2.5.

In an embodiment, the buffer layer may have a refractive index of about 1.5 to about 2.0.

In an embodiment, the display device may further include a color filter layer on the color conversion layer.

In an embodiment, the color filter layer may include: a first color filter part overlapping the first color conversion part and configured to transmit the first color light; a second color filter part overlapping the second color conversion part and configured to block the first color light and transmit the second color light; and a third color filter part overlapping the third color conversion part and configured to block the first color light and transmit the third color light.

In an embodiment, the display device may further include a capping layer in at least one selected from between the color conversion layer and the buffer layer, and between the color conversion layer and the color filter layer.

In an embodiment, the buffer layer may include: a bottom surface contacting the encapsulation member; and a top surface adjacent to the color conversion layer and including an uneven pattern.

In an embodiment, an internal space may be defined between the buffer layer and the color conversion layer.

In an embodiment, the buffer layer may contact at least one of the second color conversion part or the third color conversion part.

In an embodiment, the color conversion layer may include a quantum dot.

In an embodiment, the first color light may include a light having a wavelength region of about 410 nm to about 480 nm, the second color light may include a light having a wavelength region of about 500 nm to about 570 nm, and the third color light may include a light having a wavelength region of about 625 nm to about 675 nm.

In an embodiment, the display device may further include a low-refractive index layer between the color conversion layer and the color filter layer, the low-refractive index layer having a refractive index of about 1.1 to about 1.5.

In an embodiment of the present disclosure, a display device includes: a display element; a color conversion layer on the display element and including first to third color conversion parts each of which includes a quantum dot and that are located to be spaced apart from each other; an encapsulation member between the display element and the color conversion layer including an inorganic layer contacting the color conversion layer; and a buffer layer between the encapsulation member and the color conversion layer having a refractive index of about 1.5 to about 2.0.

In an embodiment, the second color conversion part may have a thickness greater than each of those of the first color conversion part and the third color conversion part, and the third color conversion part may have a thickness greater than that of the first conversion part in a plane.

In an embodiment, the second color conversion part may have an area greater than each of those of the first color conversion part and the third color conversion part, and the third color conversion part may have an area greater than that of the first conversion part in a plane.

In an embodiment, a difference in refractive index between the buffer layer and the inorganic layer may be about 0.5 or less.

In an embodiment, the display device may further include: a first capping layer on a top surface of the color conversion layer; and a second capping layer between the buffer layer and the color conversion layer.

In an embodiment, the buffer layer may include: a bottom surface contacting the encapsulation member; and a top surface adjacent to the color conversion layer, the top surface having an uneven pattern, wherein an internal space may be defined between the buffer layer and the color conversion layer.

In an embodiment, the internal space may be defined between each of the buffer layer and the first color conversion part and between the buffer layer and the third color conversion part.

In an embodiment of the present disclosure, a display device includes: a display element including first to third pixel regions adjacent to each other in a plane, the display element including a first organic light emitting diode overlapping the first pixel region and including a light emitting layer, a second organic light emitting diode overlapping the second pixel region and including a light emitting layer, and a third organic light emitting diode overlapping the third pixel region and including a light emitting layer; an encapsulation member on the display element and including an inorganic layer at the outermost portion thereof; a color conversion layer on the encapsulation member and including a first color conversion part located to correspond to the first organic light emitting diode, a second color conversion part located to correspond to the second organic light emitting diode, and a third color conversion part located to correspond to the third organic light emitting diode; a color filter layer on the color conversion layer; a buffer layer between the encapsulation member and the color conversion layer, wherein a difference in refractive index between the buffer layer and the inorganic layer is about 0.5 or less; a low-refractive index layer between the color conversion layer and the color filter layer; a first capping layer between the color conversion layer rand the low-refractive index layer; and a second capping layer between the buffer layer and the color conversion layer, wherein the light emitting layers of the first organic light emitting diode, the second organic light emitting diode, and the third organic light emitting diode may be integrated with each other.

BRIEF DESCRIPTION OF THE FIGURES

The accompanying drawings are included to provide a further understanding of the subject matter of the present disclosure, and are incorporated in and constitute a part of the present disclosure. The drawings illustrate exemplary embodiments of the present disclosure and, together with the description, serve to explain principles of the present disclosure. In the drawings.

DETAILED DESCRIPTION

Figure 1:
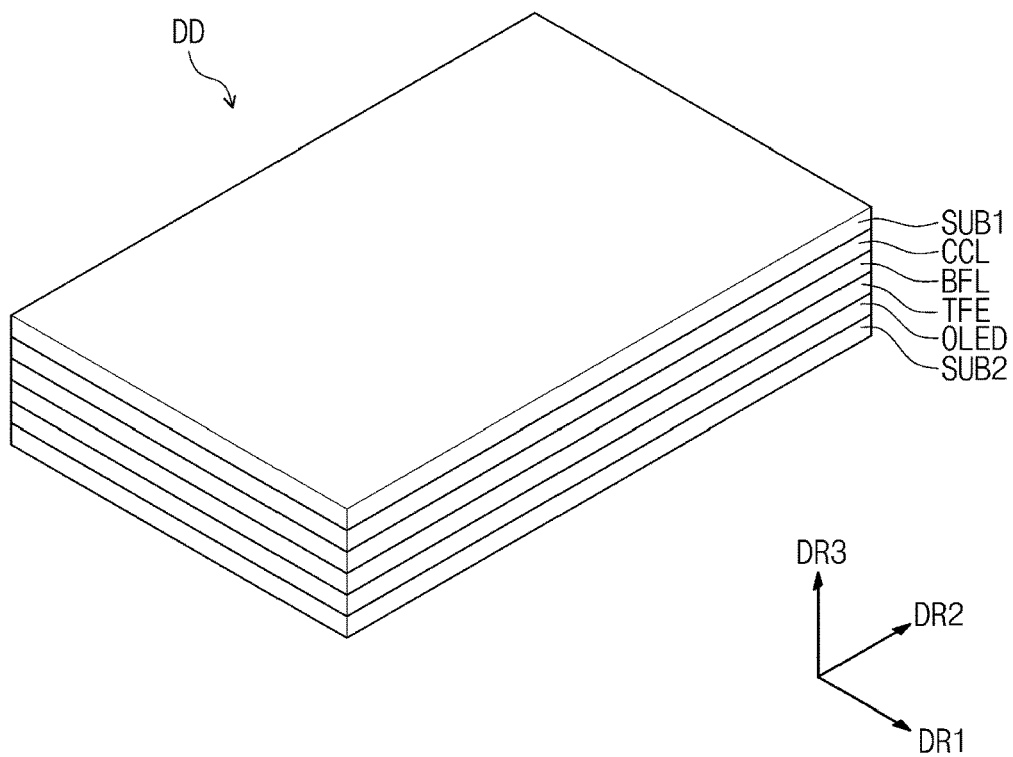
FIG. 1 is a perspective view of a display device according to an embodiment of the present disclosure.

Example embodiments of the present disclosure will be described below in more detail with reference to the accompanying drawings. Because the present disclosure may encompass diverse modified embodiments, example embodiments are illustrated in the drawings and are described in the detailed description of the present disclosure. However, this does not limit the present disclosure to the example embodiments and it should be understood that the present disclosure covers all the modifications, equivalents, and replacements within the spirit and scope of the present disclosure.

Like reference numerals refer to like elements throughout. In the drawings, the dimensions and size of each structure may be exaggerated, omitted, or schematically illustrated for convenience in description and clarity. It will be understood that although the terms such as "first" and "second" are used herein to describe various elements, these elements should not be limited by these terms. The terms are only used to distinguish one component from other components. For example, a first element referred to as a first element in one embodiment can be referred to as a second element in another embodiment without departing from the scope of the appended claims. The terms of a singular form may include plural forms unless explicitly described to the contrary.

As used herein, the meaning of the terms "include" and "comprise" includes the stated property, region, fixed number, step, process, element and/or component but does not exclude other properties, regions, fixed numbers, steps, processes, elements and/or components.

In the present disclosure, it will be understood that when a layer (or film), a region, or a plate is referred to as being "on" or "on an upper portion of" another layer, region, or plate, it can be directly on the other layer, region, or plate, or intervening layers, regions, or plates may also be present. On the contrary to this, it will be understood that when a layer, a film, a region, or a plate is referred to as being "under" or "on a lower portion of" another layer, region, or plate, it can be directly under the other layer (or film), region, or plate, or intervening layers, regions, or plates may also be present. Also, in the present disclosure, a structure in which a layer, a film, a region, or a plate is "on" another layer, film, region, or plate may include a structure in which the layer, film, region, or plate is on a lower portion and/or an upper portion of another layer, film, region, or plate.

In the present disclosure, "direct contact" may mean that there is no layer, film, region, plate, or the like between a portion of the layer, the layer, the region, the plate, or the like and the other portion. For example, "direct contact" may mean being located without using an additional member such and an adhesion member between two layers or two members.

Hereinafter, a display device according to an embodiment of the present disclosure will be described with reference to the accompanying drawings.

Figure 2:
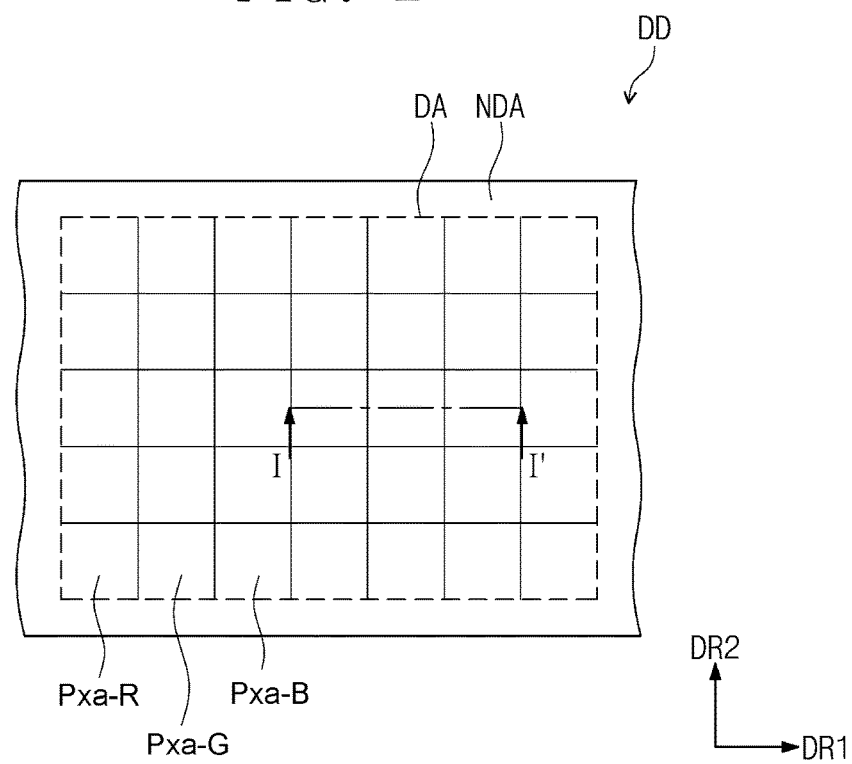
FIG. 2 is a plan view of the display device according to an embodiment of the present disclosure.
Figure 3:
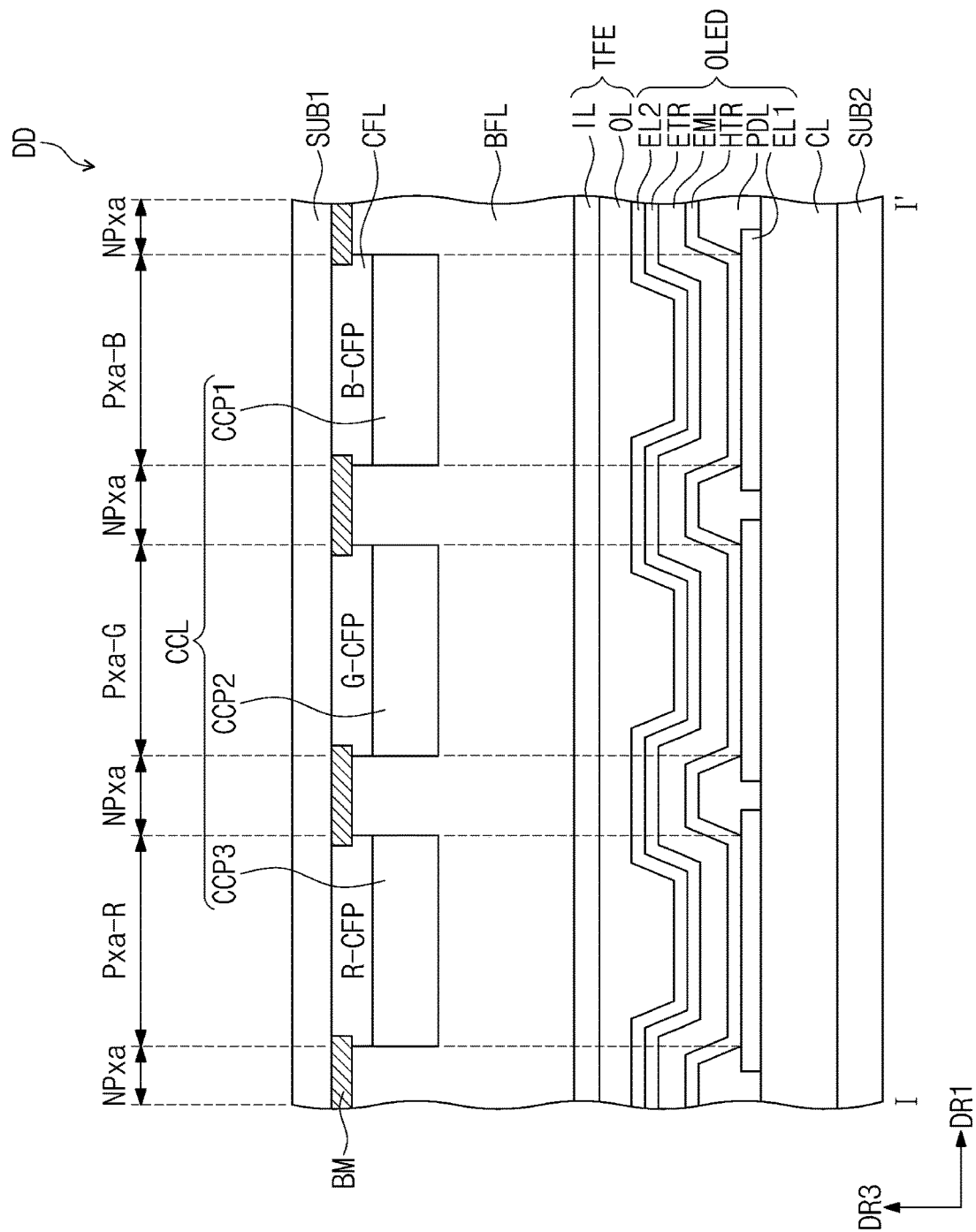
FIG. 3 is a cross-sectional view taken along line I-I' of FIG. 2.

FIG. 1 is a perspective view of a display device according to an embodiment of the present disclosure. FIG. 2 is a plan view of the display device according to an embodiment of the present disclosure, and FIG. 3 is a cross-sectional view taken along line I-I' of FIG. 2.

Referring to FIG. 1, a display device DD includes a display element, an encapsulation member TFE on the electrode element, a buffer layer BFL on the encapsulation member TFE, and a color conversion layer CCL on the buffer layer BFL. The buffer layer BFL may protect the color conversion layer CCL to improve light extraction efficiency of the display element.

The display element according to present disclosure may be an organic light emitting diode OLED as a self-luminous element, and the organic light emitting diode OLED may generate a first color light. For example, the first color light provided by the organic light emitting diode OLED may be blue light. The blue light may include a light having a wavelength region of about 410 nm to about 480 nm (e.g., a wavelength in a range of about 410 nm to about 480 nm).

The display device DD may further include a first substrate SUB1 and a second substrate SUB2, which are located to face each other. The organic light emitting diode OLED may be on the second substrate SUB2.

Referring to FIG. 2, the display device DD according to an embodiment may include a display area on which an image may be displayed and a non-display area NDA on which an image is not displayed. The non-display area NDA may be located outside the display area DA.

The display device DD may have a rectangular shape having a plane defined by an axis in a first direction DR1 and an axis in a second direction DR2. The display device DD may also have a thickness in a third direction DR3 perpendicular to the first direction DR1 and the second direction DR2. However, the present disclosure is not limited thereto. For example, the display area DA and the non-display area NDA may be relatively designed in shape.

Although the display device DD includes a planar display surface in FIG. 2, the present disclosure is not limited thereto. The display device DD according to an embodiment may include a curved display surface or a solid display surface. The solid display surface may include a plurality of display areas that indicate different directions. For example, the solid display surface may include a polygonal column-type display surface.

The display area DA may include a plurality pixel areas Pxa-B, Pxa-G, and Pxa-R. For example, the pixel areas Pxa-B, Pxa-G, and Pxa-R may be defined by a plurality of gate lines and a plurality of data lines. The pixel areas Pxa-B, Pxa-G, and Pxa-R may be arranged in a matrix form. A pixel that will be described below may be on each of the pixel areas Pxa-B, Pxa-G, and Pxa-R.

The display device DD may include a first pixel area, a second pixel area, and a third pixel area, which are adjacent to each other in the plane and emit light having wavelengths different from each other. In an embodiment, the first pixel area may be a blue pixel area Pxa-B, the second pixel area may be a green pixel area Pxa-G, and the third pixel area may be a red pixel area Pxa-R. For example, in an embodiment, the display device DD may include the blue pixel area Pxa-B, the green pixel area Pxa-G, and the red pixel area Pxa-R. The blue pixel area Pxa-B may be a blue light emitting area that is configured to emit blue light. The green pixel area Pxa-G and the red pixel area Pxa-R may be a green light emitting area configured to emit green light and a red light emitting area configured to emit red light, respectively.

An arrangement structure of the pixel areas illustrated in FIG. 2 may be called a stripe structure, but the present disclosure is not limited to the arrangement structure of the pixel areas. For example, the pixel areas may have a PenTile structure.

In an embodiment, the display device DD may be a rigid display device. However, the present disclosure is not limited thereto. For example, the display device DD according to embodiments of the present disclosure may be a flexible display device.

Referring to FIG. 3, the display device DD according to an embodiment may include a first substrate SUB1 and a second substrate SUB2. Each of the first substrate SUB1 and the second substrate SUB2 may include a polymer substrate, a plastic substrate, a glass substrate, and/or a quartz substrate. Each of the first substrate SUB1 and the second substrate SUB2 may include a transparent insulation substrate. Each of the first substrate SUB1 and the second substrate SUB2 may be rigid. Each of the first substrate SUB1 and the second substrate SUB2 may be flexible.

The display device DD may include a circuit layer CL on the second substrate SUB2. The circuit layer CL will be described herein in more detail with reference to FIG. 7.

The display device DD according to an embodiment may include a first organic light emitting diode overlapping the first pixel area Pxa-B, a second organic light emitting diode overlapping the second pixel area Pxa-G, and a third organic light emitting diode overlapping the third pixel area Pxa-R.

Each of the first to third organic light emitting diodes OLEDs may include a first electrode EL1, a hole transport region HTR, a light emitting layer EML, an electron transport region ETR, and a second electrode EL2.

The light emitting layers EML of the first to third organic light emitting diodes may have an integrated shape and be commonly located on the pixel areas Pxa-B, Pxa-G, and Pxa-R and a peripheral area NPxa. The light emitting layer EML may generate the first color light, e.g., the blue light.

The encapsulation member TFE may be on the organic light emitting diode OLED to seal the organic light emitting diode OLED. The encapsulation member TFE may include an inorganic layer IL that directly contacts the buffer layer BFL and is located at the outermost position adjacent to the color conversion layer CCL. Also, the encapsulation member TFE may further include an organic layer OL or may have a structure in which the inorganic layer IL and the organic layer OL are alternately repeatedly arranged. The encapsulation member TFE may protect the organic light emitting diode OLED against moisture/oxygen and also protect the organic light emitting diode OLED against foreign substances such as dust particles.

According to an embodiment, the inorganic layer IL may have a refractive index of about 1.5 to about 2.5. According to another embodiment, the inorganic layer IL may have a refractive index of about 1.5 to about 2.5, about 1.6 to about 2.4, or about 1.8 to about 2.3. The inorganic layer IL is not particularly limited as long as the material satisfies the refractive index. For example, the inorganic layer IL may be made of a material including silicon nitride ($SiN_x$), silicon oxynitride ($SiO_yN_x$), silicon oxide ($SiO_y$), titanium oxide ($TiO_y$), and/or aluminum oxide ($AlO_y$).

The organic layer OL may include acrylate-based organic materials, but is not particularly limited thereto. The inorganic layer IL may be formed through a deposition method or the like, and the organic layer OL may be formed through a deposition method, a coating method, or the like.

The color conversion layer CCL may include a first color conversion part CCP1 configured to transmit the first color light, a second color conversion part CCP2 configured to convert the first color light into a second color light, and a third color conversion part CCP3 configured to convert the first color light into a third color light. For example, the second color light may be green light, and the green light may include a light having a wavelength region of about 500 nm to about 570 nm (e.g., a wavelength in a range of about 500 nm to about 570 nm). The third color light may be red light, and the red light may include a light having a wavelength region of about 625 nm to about 675 nm (e.g., a wavelength in a range of about 625 nm to about 675 nm).

The color conversion layer CCL may include the plurality of color conversion parts CCP1, CCP2, and CCP3. According to an embodiment, the first to third color conversion parts CCP1, CCP2, and CCP3 may be located to be spaced apart from each other in a plane. Referring to FIG. 3, the first to third color conversion parts CCP1, CCP2, and CCP3 may be arranged to be spaced apart from each other in the plane defined by the axis in the first direction and the axis in the third direction DR3.

The first color conversion part CCP1 may be located to correspond to the first pixel area Pxa-B, the second color conversion part CCP2 may be located to correspond to the second pixel area Pxa-G, and the third color conversion part CCP3 may be located to correspond to the third pixel area Pxa-R.

According to an embodiment, the color conversion layer CCL may include a light emitting body, and the light emitting body may include a quantum dot. The quantum dot may be selected from Group II-VI compounds, Group III-V compounds, Group IV-VI compounds, Group IV elements, Group IV compounds, and a combination thereof.

The Group II-VI compounds may be selected from binary element compounds selected from the group consisting of CdSe, CdTe, ZnS, ZnSe, ZnTe, ZnO, HgS, HgSe, HgTe, MgSe, MgS, and a combination thereof, ternary element compounds selected from the group consisting of AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a combination thereof, and quaternary element compounds selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and a combination thereof.

The Group III-V compounds may be selected from binary element compounds selected from the group consisting of GaN, GaP, GaAs, GaSb, AlN, AlP, AlAs, AlSb, InN, InP, InAs, InSb, and a combination thereof, ternary element compounds selected from the group consisting of GaNP, GaNAs, GaNSb, GaPAs, GaPSb, AlNP, AlNAs, AlNSb, AlPAs, AlPSb, InNP, InNAs, InNSb, InPAs, InPSb, GaAlNP, and a combination thereof, and quaternary element compounds selected form the group consisting of GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a combination thereof. The Group IV-VI compounds may be selected from binary element compounds selected from the group consisting of SnS, SnSe, SnTe, PbS, PbSe, PbTe, and a combination thereof, ternary element compounds selected from the group consisting of SnSeS, SnSeTe, SnSTe, PbSeS, PbSeTe, PbSTe, SnPbS, SnPbSe, SnPbTe, and a combination thereof, and quaternary element compounds selected form the group consisting of SnPbSSe, SnPbSeTe, SnPbSTe, and a combination thereof. The Group IV elements may be selected from the group consisting of Si, Ge, and a combination thereof. The Group IV compounds may be binary element compounds selected from the group consisting of SiC, SiGe, and a combination thereof.

Here, the binary element compounds, the ternary element compounds, and the quaternary element compounds may exist in the particle at a uniform (e.g., substantially uniform) concentration or exist in the particle in a state in which a concentration distribution is divided into partially different states.

The quantum dot may have a core shell structure including a shell surrounding a core. In some embodiments, the quantum dot may have a core/shell structure in which one quantum dot surrounds the other quantum dot. An interface between the core and the shell may have a concentration gradient in which an element existing in the shell has a concentration that gradually decreases toward a center of the quantum dot.

The quantum dot may have a particle having a size of a nano scale. The quantum dot may have a full width of half maximum (FWHM) of an emission wavelength spectrum of about 45 nm or less, for example, about 40 nm or less, or about 30 nm or less. In this range, color purity and color reproducibility may be improved. Also, light emitted through the quantum dot may be emitted in all directions to improve an optical viewing angle.

Also, the quantum dot may have any suitable shape that is generally used in the art, and is not specifically limited to any particular shape. In some embodiments, the quantum dot may have a spherical shape, a pyramidal shape, a multi-arm shape, a cubic nanoparticle shape, a nanotube shape, a nanowire shape, a nanofiber shape, a nanoplate particle shape, and/or the like.

The light emitted from the quantum dot may vary in color according to a particle size of the quantum dot. For example, the quantum dot provided in the second color conversion part CCP2 may have a particle size less than that of the quantum dot provided in the third color conversion part CCP3. Here, the quantum dot provided in the second color conversion part CCP2 may emit light having a wavelength shorter than that of light emitted from the quantum dot provided in the third color conversion part CCP3.

Although the first to third color conversion parts CCP1, CCP2, and CCP3 have the same (e.g., substantially the same) area and/or thickness in the drawings, the present disclosure is not limited thereto. For example, the first to third color conversion parts CCP1, CCP2, and CCP3 may have different areas and/or thicknesses.

In some embodiments, a light blocking part BM may be between the first and second color conversion parts CCP1 and CCP2, which are spaced apart from each other, and/or between the second and third color conversion parts CCP2 and CCP3, which are spaced apart from each other.

In an embodiment, the display device may include a color filter layer CFL. The color filter layer CFL may be on the color conversion layer CCL and include first to third color filter parts B-CFP, G-CFP, and R-CFP and the light blocking part BM.

In an embodiment, the first to third color filter parts B-CFP, G-CFP, and R-CFP may be located to be spaced apart from each other in the plane. Referring to FIG. 3, the first to third color filter parts B-CFP, G-CFP, and R-CFP may be arranged to be spaced apart from each other in the plane defined by the axis in the first direction and the axis in the third direction DR3.

The first color filter part B-CFP may be located to correspond to the first color conversion part CCP1 and be configured to transmit the light having the first color. The second color filter part G-CFP may be located to correspond to the second color conversion part CCP2 and be configured to block the light having the first color and transmit the light having the second color. The third color filter part R-CFP may be located to correspond to the third color conversion part CCP3 and be configured to block the light having the first color and transmit the light having the third color. The display device DD may include a color filter layer CFL to effectively reduce reflection of external light.

The light blocking part BM may be provided to correspond to a peripheral area NPxa. The light blocking part BM may contain an organic light blocking material or an inorganic light blocking material including a black pigment or dye. The light blocking part BM may prevent or reduce occurrence of a light leakage phenomenon and may distinguish a boundary between the color filter parts adjacent to each other. At least a portion of the light blocking part BM may be located to overlap the color filter part that is adjacent thereto. For example, at least a portion of the light blocking part BM may be located to overlap the color filter parts adjacent thereto in a thickness direction in the plane defined by the axis in the first direction DR1 and the axis in the third direction DR3. However, the present disclosure is not limited thereto.

Although the light blocking part BM includes the color filter layer CFL in an embodiment of the present disclosure, the present disclosure is not limited thereto.

The buffer layer BFL is between the encapsulation member TFE and the color conversion layer CCL. The buffer layer BFL may be between the encapsulation member TFE and the color conversion layer CCL to prevent or reduce contact of the color conversion layer CCL with the encapsulation member TFE and to improve light extraction efficiency of the display device DD.

In an embodiment, the buffer layer BFL may be filled between the encapsulation member TFE and the color conversion layer CCL. The filling between the encapsulation member TFE and the color conversion layer CCL means that a space between the encapsulation member TFE and the color conversion layer CCL is completely filled with the buffer layer BFL so that an internal space is not generated between the encapsulation member TFE and the color conversion layer CCL, and the buffer layer BFL contacts all of the encapsulation member TFE and the first to third color conversion parts CCP1, CCP2, and CCP3 of the color conversion layer CCL.

The buffer layer BFL may prevent or reduce oxidation of the quantum dot provided in the color conversion layer CCL. Thus, the display device DD may maintain its light extraction efficiency without it being greatly diminished.

In an embodiment, the buffer layer BFL may be directly on the inorganic layer IL located at the outermost portion of the encapsulation member. A difference in refractive index between the buffer layer BFL and the inorganic layer IL may be about 0.5 or less. In some embodiments, the buffer layer BFL may have a refractive index of about 1.5 to about 2.0. The buffer layer BFL may include an inorganic binder, an organic binder, or a liquid crystal compound so as to satisfy the refractive index having the above-described range, but the present disclosure is not limited thereto.

Also, the buffer layer BFL may further include a leveling agent. In this case, the buffer layer BFL may have low conformality and be flat even when the thicknesses and/or areas of the first to third color conversion parts CCP1, CCP2, and CCP3 of the color conversion layer CCL are different from each other. The buffer layer BFL may be formed by an one drop fill (ODF) manner in which a buffer layer material is injected into one substrate before polymerization, and then, the two substrates are polymerized and attached to each other.

The refractive index of the buffer layer BFL will be described herein in more detail with reference to FIGS. 4A-4B.

Figure 4A:
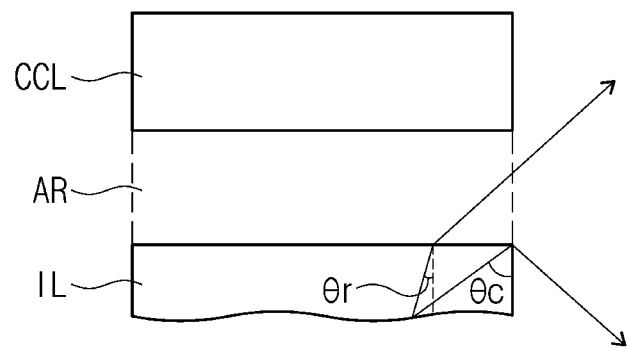
FIG. 4A is a cross-sectional view illustrating an optical path of a display device according to a comparison example of the present disclosure.

FIG. 4A is a cross-sectional view illustrating an optical path of a display device according to a comparison example. FIG. 4B is a cross-sectional view illustrating an optical path of the display device according to an embodiment of the present disclosure. FIG. 5 is a graph illustrating light conversion rates of the display devices according to a comparison example and an embodiment of the present disclosure.

Referring to FIG. 4A, unlike this embodiment, the buffer layer BFL is not provided between the inorganic layer IL of the encapsulation member TFE and the color conversion layer CCL, and also, the internal space AR does exist. The internal space may be in a vacuum state and have a refractive index of about 1.0. Thus, a difference in refractive index between the inorganic layer IL and the internal space AR is relatively large.

When light traveling from the inorganic layer IL toward the color conversion layer CCL is defined as incident light, an angle between a virtual line perpendicular to an interface between the inorganic layer IL and the internal space AR and the incident light may be defined as an incident angle. When the incident angle is greater than a total reflection angle, 100% of the incident light is reflected at the interface between the inorganic layer IL and the internal space AR. A degree of the total reflection angle depends on Snell's law.

When the display device does not comprise buffer layer BFL, because a difference in refractive index between the inorganic layer IL and the internal space AR is relatively large, the total reflection angle is relatively small, and a portion of the incident light having an incident angle $\theta_c$ greater than the total reflection angle is totally reflected at the interface between the inorganic layer IL and the internal space AR and thus does not reach the color conversion layer CCL. Also, the remaining portion of the incident light has an incident angle $\theta_r$ less than the total reflection angle and thus is not totally reflected at the interface between the inorganic layer IL and the internal space AR. However, the incident light is greatly refracted due to the difference in refractive index between the inorganic layer IL and the internal space AR and is not transmitted to a front surface of the color conversion layer CCL. Thus, when the buffer layer BFL is not provided between the inorganic layer IL and the color conversion layer CCL, but only the internal space AR exists, an amount of light transmitted to the color conversion layer CCL may be reduced to deteriorate the light extraction efficiency.

Figure 4B:
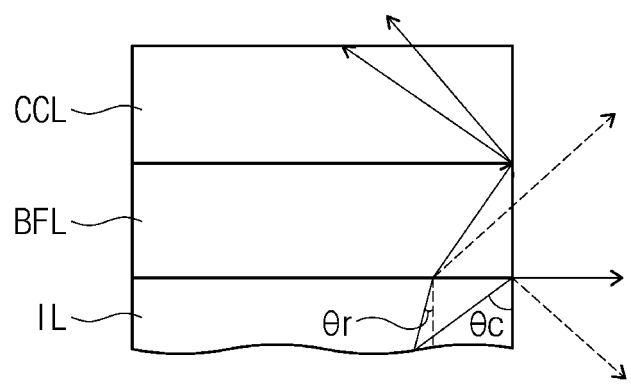
FIG. 4B is a cross-sectional view illustrating an optical path of the display device according to an embodiment of the present disclosure.
Figure 5:
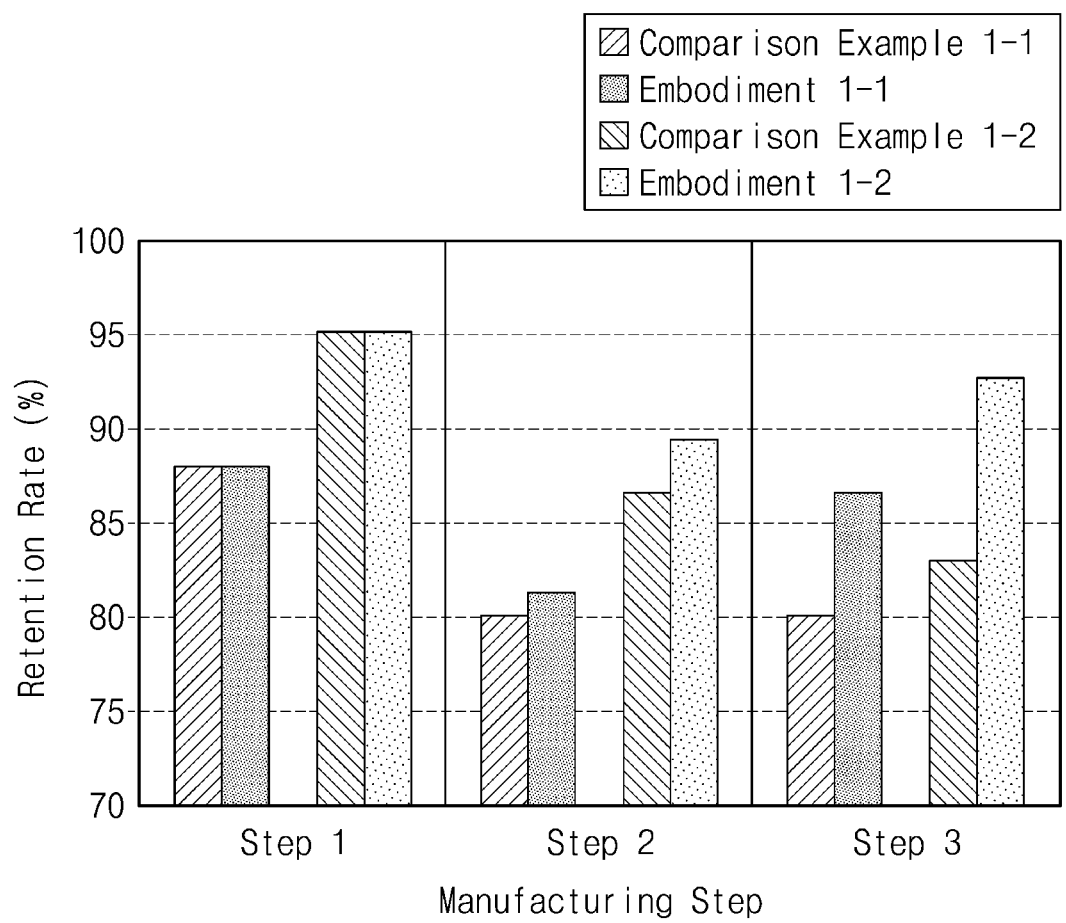
FIG. 5 is a graph illustrating light conversion rates of the display devices according to a comparison example and an embodiment of the present disclosure.

Referring to FIG. 4B, according to this embodiment, the buffer layer BFL is between the inorganic layer IL and the color conversion layer CCL. Because a difference in refractive index between the buffer layer BFL and the inorganic layer IL is about 0.5 or less, the total reflection angle may be relatively large. Thus, unlike that a portion of the incident light is totally reflected to travel as indicated by a dotted line of FIG. 4A, because the incident angle $\theta_c$ is less than the total reflection angle, the incident angle $\theta_c$ is not totally reflected at the interface between the inorganic layer IL and the buffer layer BFL but is transmitted to the side surface. Also, remaining incident light having the incident angle $\theta_r$ that is greatly reflected to travel as indicated by the dotted line of FIG. 4A may be refracted at a smaller angle to pass through the buffer layer BFL. Then, the incident light reaches the interface between the buffer layer BFL and the color conversion layer CCL and then is reflected again to be incident into the front surface of the color conversion layer CCL.

Thus, the display device DD according to an embodiment may include the buffer layer BFL, which is controlled in refractive index, to induce light collection into the color conversion layer CCL, thereby improving the light extraction efficiency.

FIG. 5 is a graph illustrating results obtained by comparing retention rates in the light conversion efficiency according to a comparison example and an embodiment of the present disclosure. To confirm an effect when the buffer layer BFL is provided, a laminate in which the substrate, the color conversion layer, and the buffer layer are sequentially laminated is provided for an embodiment, and a laminate in which the substrate and the color conversion layer are sequentially laminated is provided for a comparison example. Embodiment 1-1 and Comparison Example 1-1 represent retention rates measured in the third light conversion part, and Embodiment 1-2 and Comparison Example 1-2 represent retention rates measured in the second color conversion part. A manufacturing process is largely divided into three steps, and a retention rate (%) is calculated by measuring light conversion efficiency just after each step. Step 1 is a process of thermally treating each laminate at a temperature of 180° C. for 30 minutes, Step 2 is a process of forming an inorganic layer, and Step 3 is a process of thermally treating each laminate at a temperature of 230° C. for 30 minutes.

In FIG. 5, the retention rate (%) is a value obtained by measuring the light conversion efficiency of each laminate before Step 1 is performed and then converting a degree of maintaining initial light conversion efficiency into a percent (%) value when the above-described light conversion efficiency is referred to as the initial light conversion efficiency. For example, when the initial light conversion efficiency is about 24%, and the light conversion efficiency measured in Step 1 is about 20%, the retention rate in Step 1 is about 83%.

In Comparison Example 1-1, the retention rate is lowered to values of 88%→80%→80%, i.e., lowered by about 8% when compared to the initial retention rate. On the other hand, in Embodiment 1-1, the retention rate is lowered to values of 88%→81%→87%, i.e., lowered by only about 1% when compared to the initial retention rate. In Comparison Example 1-2, the retention rate is lowered to values of 95%→87%→83%, i.e., lowered by about 12% when compared to the initial retention rate. On the other hand, in Embodiment 1-2, the retention rate is lowered to values of 95%→89%→93%, i.e., lowered by only about 2% when compared to the initial retention rate.

For example, when the buffer layer BFL is between the inorganic layer IL and the color conversion layer CCL in the display device DD, all of the color conversion layers CCL, which are located to be spaced apart from each other, may be effectively protected. Thus, even though the thermal process at a high temperature is performed, a high level of the light conversion efficiency may be continuously maintained.

Figure 6:
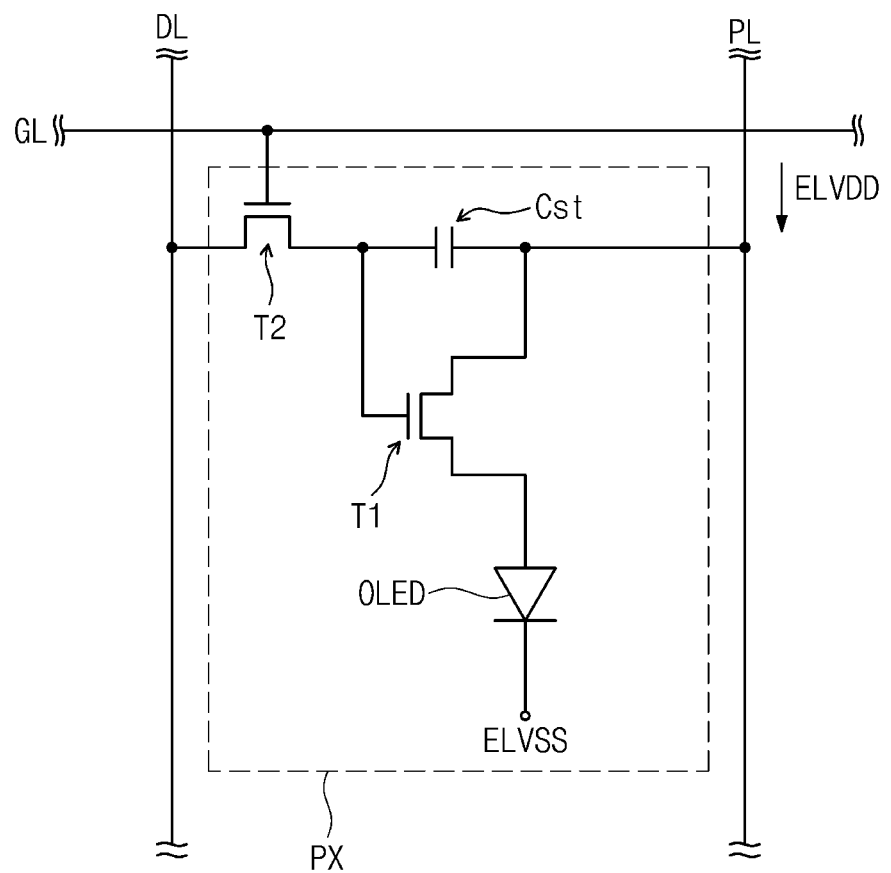
FIG. 6 is an equivalent circuit diagram of a pixel according to an embodiment of the present disclosure.
Figure 7:
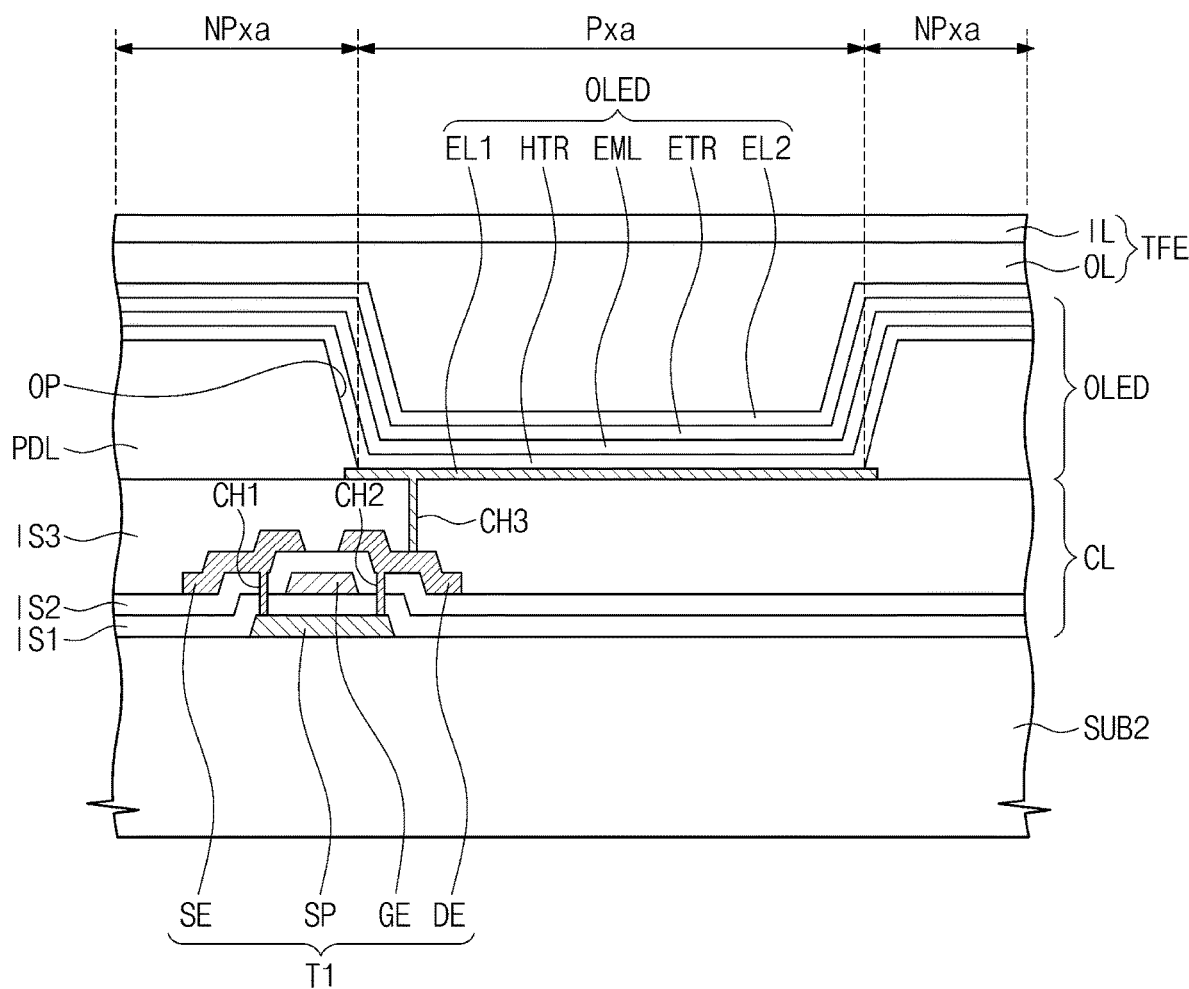
FIG. 7 is a cross-sectional view illustrating a portion of the display device according to an embodiment of the present disclosure.

FIG. 6 is an equivalent circuit diagram of a pixel according to an embodiment of the present disclosure. FIG. 7 is a cross-sectional view illustrating a portion of the display device according to an embodiment of the present disclosure.

FIG. 6 illustrates one scan line GL, one data line DL, a power line PL, and a pixel PX coupled to (e.g., connected to) the scan line GL, the data line DL, and the power line PL. The configuration of the pixel PX may not be limited to that of FIG. 6 but may be deformable.

An organic light emitting diode OLED may be a top emission-type diode or a bottom emission-type diode. The pixel PX includes a first transistor T1 (or a switching transistor), a second transistor T2 (or a driving transistor), and a capacitor Cst as the pixel driving circuit driving the organic light emitting diode OLED. A first power voltage ELVDD is provided to the second transistor T2, and a second power voltage ELVSS is provided to the organic light emitting diode OLED. The second power voltage ELVSS may be less than the first power voltage ELVDD.

The first transistor T1 outputs a scan signal applied to the data line DL in response to a scanning signal applied to the gate line GL. The capacitor Cst charges a voltage to correspond to the data signal received from the first transistor T1. The second transistor T2 is coupled to (e.g., connected to) the organic light emitting diode OLED. The second transistor T2 controls driving current flowing through the organic light emitting diode OLED to correspond to an amount of charges stored in the capacitor Cst.

The equivalent circuit is merely an example, and thus, the present disclosure is not limited thereto. The pixel PX may further include a plurality of transistors and may include a larger number of capacitors. The organic light emitting diode OLED may be coupled between (e.g., connected between) the power line PL and the second transistor T2.

FIG. 7 is a cross-sectional view corresponding to one pixel. The circuit layer CL, the organic light emitting diode OLED, and the encapsulation member TFE are sequentially on the second substrate layer SUB2.

In an embodiment, the circuit layer CL may include a first insulation layer IS1, a second insulation layer IS2, and a third insulation layer IS3. Each of the first insulation layer IS1 and the second insulation layer IS2 may include an inorganic material, but the kind thereof is not particularly limited. The third insulation layer IS3 may include an organic material, but the kind thereof is not particularly limited. In some embodiments, a barrier layer may be additionally on the second substrate SUB2. Each of the first insulation layer IS1, the second insulation layer IS2, and the third insulation layer IS3 may have a single layer or multi-layered structure.

The first transistor T1 includes a semiconductor pattern SP, a control electrode GE, an input electrode SE, and an output electrode DE. The semiconductor pattern SP is on the second substrate SUB2. The semiconductor pattern SP may include a crystalline semiconductor material or amorphous silicon.

The first insulation layer IS1 is on the second substrate SUB2. The first insulation layer IS1 may commonly overlap the display area DA and the non-display area NDA and cover the semiconductor pattern SP.

The control electrode GE is on the first insulation layer IS1. The control electrode GE overlaps the semiconductor pattern SP. The control electrode GE may be manufactured through the same photolithography process as the scan line GL (see FIG. 6).

The second insulation layer IS2 is on the first insulation layer IS1. The second insulation layer IS2 covers the first insulation layer IS1 and the control electrode GE. The input electrode SE and the output electrode DE are on the second insulation layer IS2. The input electrode SE and the output electrode DE contact the semiconductor pattern SP through a plurality of contact holes CH1 and CH2 defined in the insulation layers IS1 and IS2, respectively. The first transistor T1 may be changed into a bottom gate structure.

The third insulation layer IS3 covering the first thin film transistor T1 is on the second insulation layer IS2. The third insulation layer 3 may provide a polarization surface.

The organic light emitting diode OLED and a pixel defining layer PDL are on the third insulation layer IS3, which may include a contact hole CH3 through which the first electrode EL1 contacts the output electrode DE. The pixel defining layer PDL may include an organic material. An opening OP of the pixel defining layer PDL exposes at least a portion of the first electrode EL1. The opening OP of the pixel defining layer PDL may define an emission area Pxa of the pixel. In an embodiment, the pixel defining layer PDL may be omitted.

In an embodiment, the emission area Pxa may overlap at least one of the first or second transistor T1 or T2. The opening OP may be widened, and the first electrode EL1 may be further widened.

The first electrode EL1 is on the third insulation layer IS3. The first electrode EL1 may be made of a metal alloy or a conductive compound. The first electrode EL1 may be an anode. The first electrode EL1 may be a transmissive electrode, a transflective electrode, or a reflective electrode.

A hole transport region HTR is provided on the first electrode EL1. The hole transport region HTR may include at least one of a hole injection layer, a hole transport layer, a hole buffer layer, or an electron blocking layer.

The hole transport region HTR may have a single layer made of a single material, a single layer made of materials different from each other, or a multi-layered structure including a plurality of layers made of materials different from each other.

For example, the hole transport region HTR may have a single layer structure of the hole injection layer or the hole transport layer and also a single layer structure made of a hole injection material or a hole transport material. Also, the hole transport region HTR may have a single layer structure formed of a plurality of different materials or a structure of the hole injection layer/the hole transport layer, the hole injection layer/the hole transport layer/the buffer layer, the hole injection layer/the hole buffer layer, the hole transport layer/the hole buffer layer, or the hole injection layer/the hole transport layer/the electron blocking layer, which are successively laminated from the first electrode EL1, but is not limited thereto.

As described above, the hole transport region HTR according to an embodiment may further include at least one of the hole buffer layer or the electron blocking layer in addition to the hole injection layer and the hole transport layer, but is not limited thereto.

The light emitting layer EML may be on the hole transport region HTR. The light emitting layer EML may have a thickness of, for example, about 100 Å to about 300 Å. The light emitting layer EML may have a single layer structure formed of a single material, a single layer structure formed of materials different from each other, or a multi-layered structure including a plurality of layers formed of materials different from each other.

The light emitting layer EML may include a fluorescent light emitting material or a phosphorescent light emitting material. In an embodiment, the light emitting layer EML may emit blue light. The light emitting layer EML may emit a light having a wavelength region of about 410 nm to about 480 nm (e.g., a wavelength in a range of about 410 nm to about 480 nm).

The electron transport region ETR may be provided on the light emitting layer EML. The electron transport region ETR may include at least one of an hole blocking layer, an electron transport layer, or an electron injection layer, but is not limited thereto.

The electron transport region ETR may have a single layer made of a single material, a single layer made of materials different from each other, or a multi-layered structure including a plurality of layers made of materials different from each other. For example, the electron transport region ETR may have a single layer structure of the electron injection layer or the electron transport layer and also a single layer structure made of an electron injection material or an electron transport material. Also, the electron transport region ETR may have a single layer structure made of a plurality of materials different from each other or a structure of the electron transport layer/the electron injection layer or the hole blocking layer/the electrode transport layer/the electrode injection layer, which are sequentially laminated from the light emitting layer EML, but is not limited thereto.

The second electrode EL2 may be on the electron transport region HTR. The second electrode EL2 may have conductivity. The second electrode EL2 may be made of a metal alloy or a conductive compound. The second electrode EL2 may be a cathode. The second electrode EL2 may be a transmissive electrode, a transflective electrode, or a reflective electrode.

In some embodiments, the second electrode EL may be coupled to (e.g., connected to) an auxiliary electrode. When the second electrode EL2 is coupled to (e.g., connected to) the auxiliary electrode, the second electrode EL2 may be reduced in resistance.

The encapsulation member TFE may be on the second electrode EL2. The encapsulation member TFE may be commonly located on the pixel areas Pxa-B, Pxa-G, and Pxa-R and the peripheral area NPxa. The encapsulation member TFE may directly cover the second electrode EL2. The encapsulation member TFE may include at least one inorganic layer and further include an organic layer. In some embodiments, the encapsulation member TFE may have a structure in which the inorganic layer and the organic layer are alternately repeated. In an embodiment, the encapsulation member TFE may include the inorganic layer IL at the outermost portion thereof.

Figure 8:
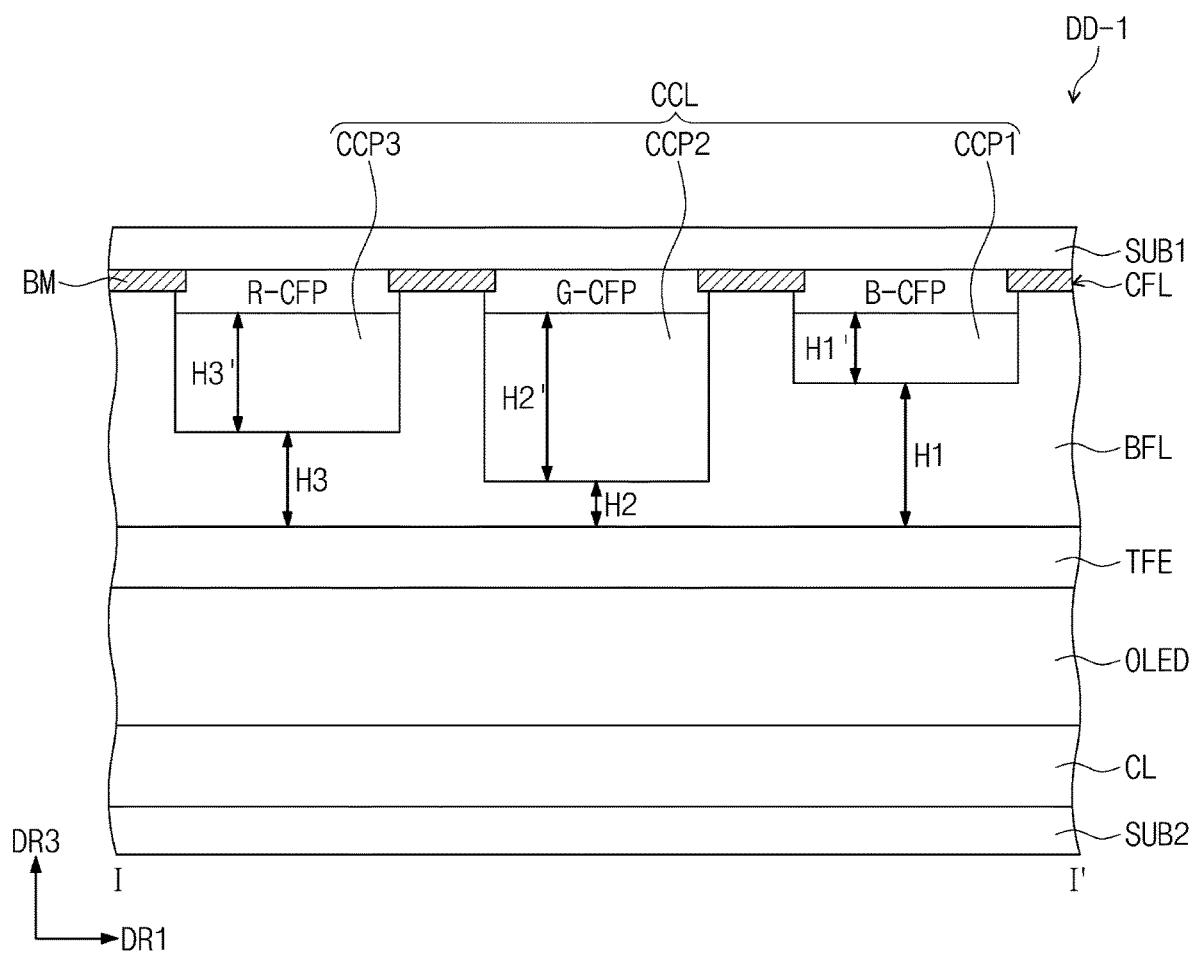
FIG. 8 is a cross-sectional view of the display device according to an embodiment of the present disclosure.
Figure 9:
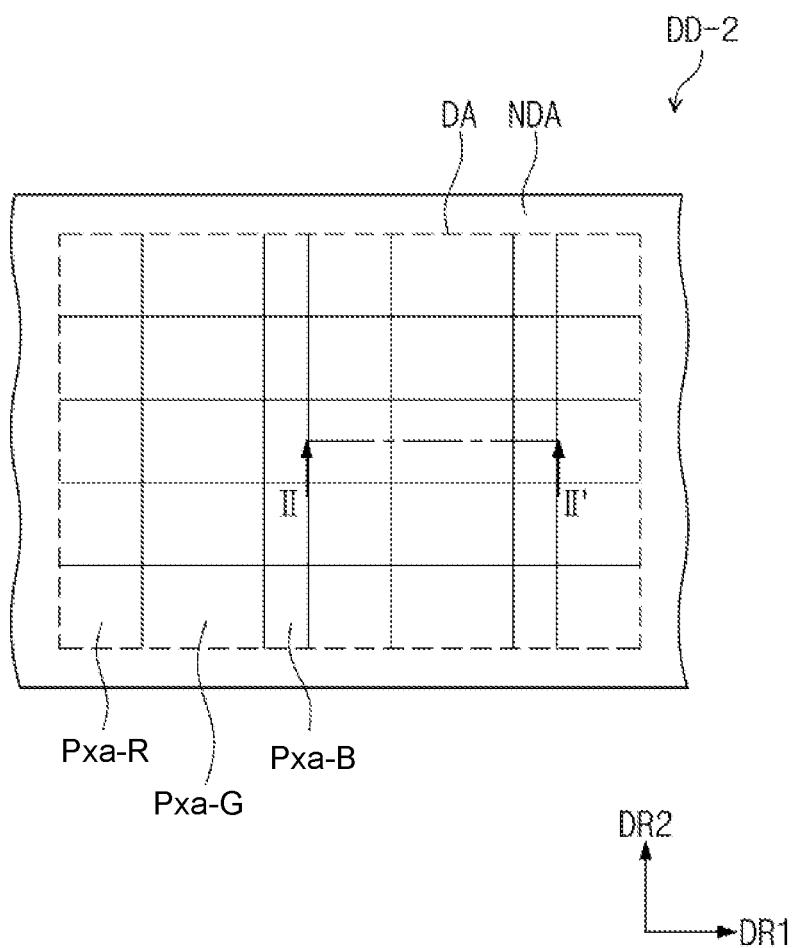
FIG. 9 is a plan view of the display device according to an embodiment of the present disclosure.
Figure 10:
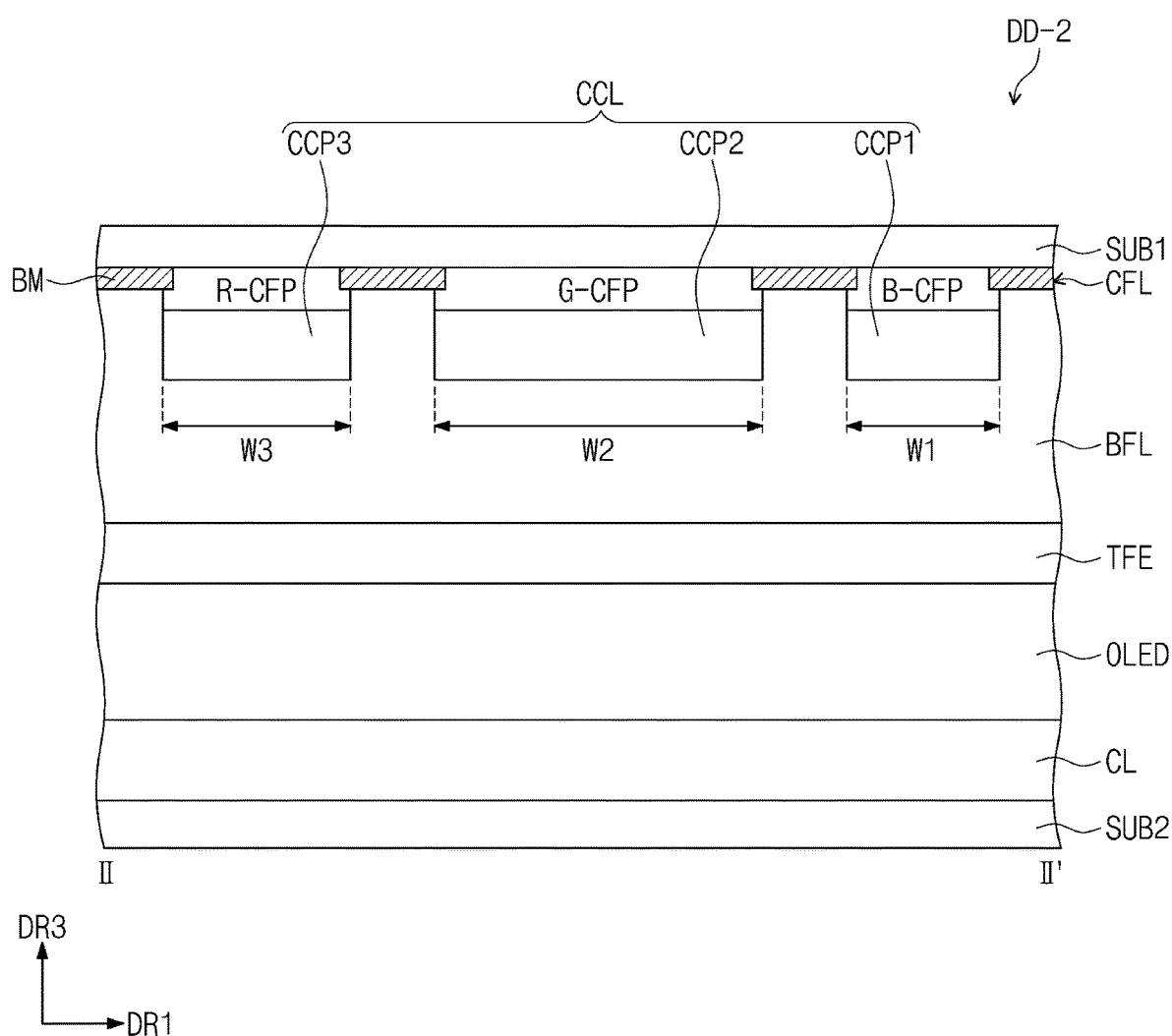
FIG. 10 is a cross-sectional view taken along line II-II' of FIG. 9.

FIG. 8 is a cross-sectional view of the display device according to an embodiment of the present disclosure. FIG. 9 is a plan view of the display device according to an embodiment of the present disclosure. FIG. 10 is a cross-sectional view taken along line II-II' of FIG. 9.

In FIGS. 8 and 10, the organic light emitting diode OLED and the encapsulation member TFE are schematically illustrated when compared to FIG. 3. Hereinafter, duplicative descriptions of features already described with reference to FIGS. 1-7 may not be repeated.

Referring to a display device DD-1 of FIG. 8, in the color conversion layer CCL, the first to third color conversion parts CCP1, CCP2, and CCP3 may have thicknesses different from each other.

In an embodiment, in the plane defined by the axis in the first direction DR1 and the axis in the third direction DR3, a thickness H may be defined as a length measured in the third direction DR3. Here, a thickness of the first color conversion part CCP1 may be defined as H1', a thickness of the second color conversion part CCP2 may be defined as H2', and a thickness of the third color conversion part CCP3 may be defined as H3'. Also, a thickness from the interface between the encapsulation member TFE and the buffer layer BFL to the first color conversion part CCP1 may be defined as H1, a thickness from the interface between the encapsulation member TFE and the buffer layer BFL to the second color conversion part CCP2 may be defined as H2, and a thickness from the interface between the encapsulation member TFE and the buffer layer BFL to the third color conversion part CCP3 may be defined as H3.

The thickness H2' of the second color conversion part CCP2 may be greater than each of the thickness H1' of the first color conversion part CCP1 and the thickness H3' of the third color conversion part CCP3, and the thickness H3' of the third color conversion part CCP3 may be greater than the thickness H1' of the first color conversion part CCP1. For example, the following equation may be satisfied: H2'>H3'>H1'. Thus, the thicknesses from the interface between the encapsulation member TFE and the buffer layer BFL to the color conversion part CCP may have values that satisfy the following equation: H1>H3>H2.

As the color conversion part CCP increases in thickness, a larger amount of light emitting bodies may be provided to improve the light conversion rate. The second color conversion part CCP2 may have a relatively low light conversion rate for converting the first color light into the second color light. Thus, the second color conversion part CCP2 may have a thickness greater than that of each of the first color conversion part CCP1 and the third color conversion part CCP3. Because the first color conversion part CCP1 transmits the first color light, the first color conversion part CCP1 may have the smallest thickness.

Referring to FIGS. 9-10, in the color conversion layer CCL, the first to third color conversion parts CCP1, CCP2, and CCP3 may have areas different from each other.

Referring to FIG. 9, in the plane defined by the axis in the first direction DR1 and the axis in the second direction DR2, the first pixel area Pxa-B, the second pixel area Pxa-G, and the third pixel area Pxa-R may have areas different from each other. The fact that the areas of the first pixel area Pxa-B, the second pixel area Pxa-G, and the third pixel area Pxa-R are different from each other means that the first electrode EL1 of the organic light emitting diode OLED, the color conversion part CCP, and the like have areas different from each other.

In an embodiment, the second pixel area Pxa-G may have an area greater than that of each of the first pixel area Pxa-B and the third pixel area Pxa-R, and the third pixel area Pxa-R may have an area greater than that of the first pixel area Pxa-B.

Referring to FIG. 10, in the plane defined by the axis in the first direction DR1 and the axis in the third direction DR3, when the first to third color conversion parts CCP1, CCP2, and CCP3 have the same (e.g., substantially the same) thickness, an area W may be defined as a value measured in the first direction DR1. Here, an area of the first color conversion part CCP1 may be defined as W1, an area of the second color conversion part CCP2 may be defined as W2, and an area of the third color conversion part CCP3 may be defined as W3.

The area W2 of the second color conversion part CCP2 may be greater than each of the area W1 of the first color conversion part CCP1 and the area W3 of the third color conversion part CCP3, and the area W3 of the third color conversion part CCP3 may be greater than the area W1 of the first color conversion part CCP1. For example, the following equation may be satisfied: W2>W3>W1.

As the color conversion part CCP increases in area, a larger amount of light emitting bodies may be provided to improve the light conversion rate. The second color conversion part CCP2 may have a relatively low light conversion rate for converting the first color light into the second color light. Thus, the second color conversion part CCP2 may have an area greater than that of the third color conversion part CCP3. Because the first color conversion part CCP1 transmits the first color light, the first color conversion part CCP1 may have the smallest area.

Figure 11:
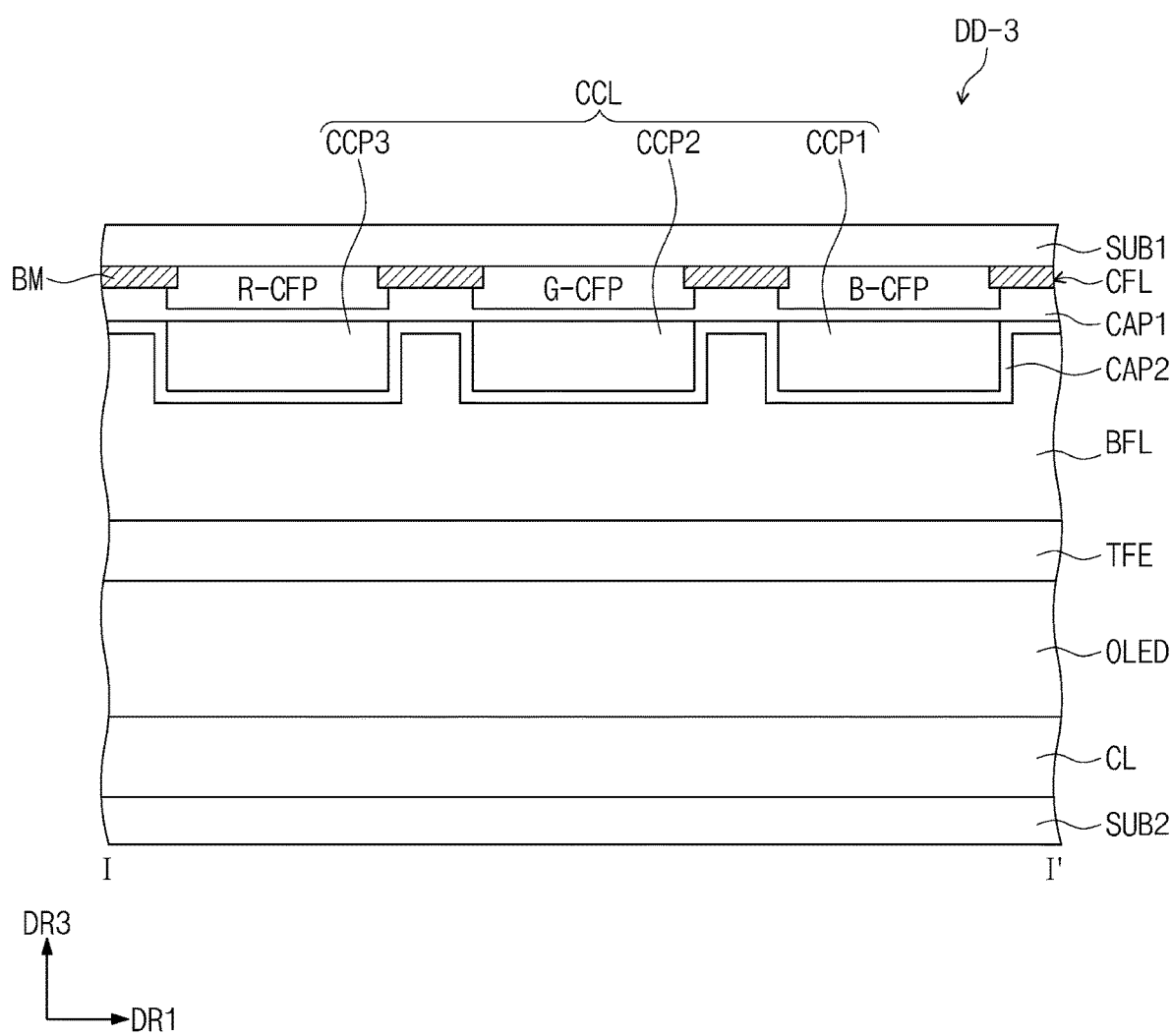
FIG. 11 is a cross-sectional view of a display device according to an embodiment of the present disclosure.
Figure 12:
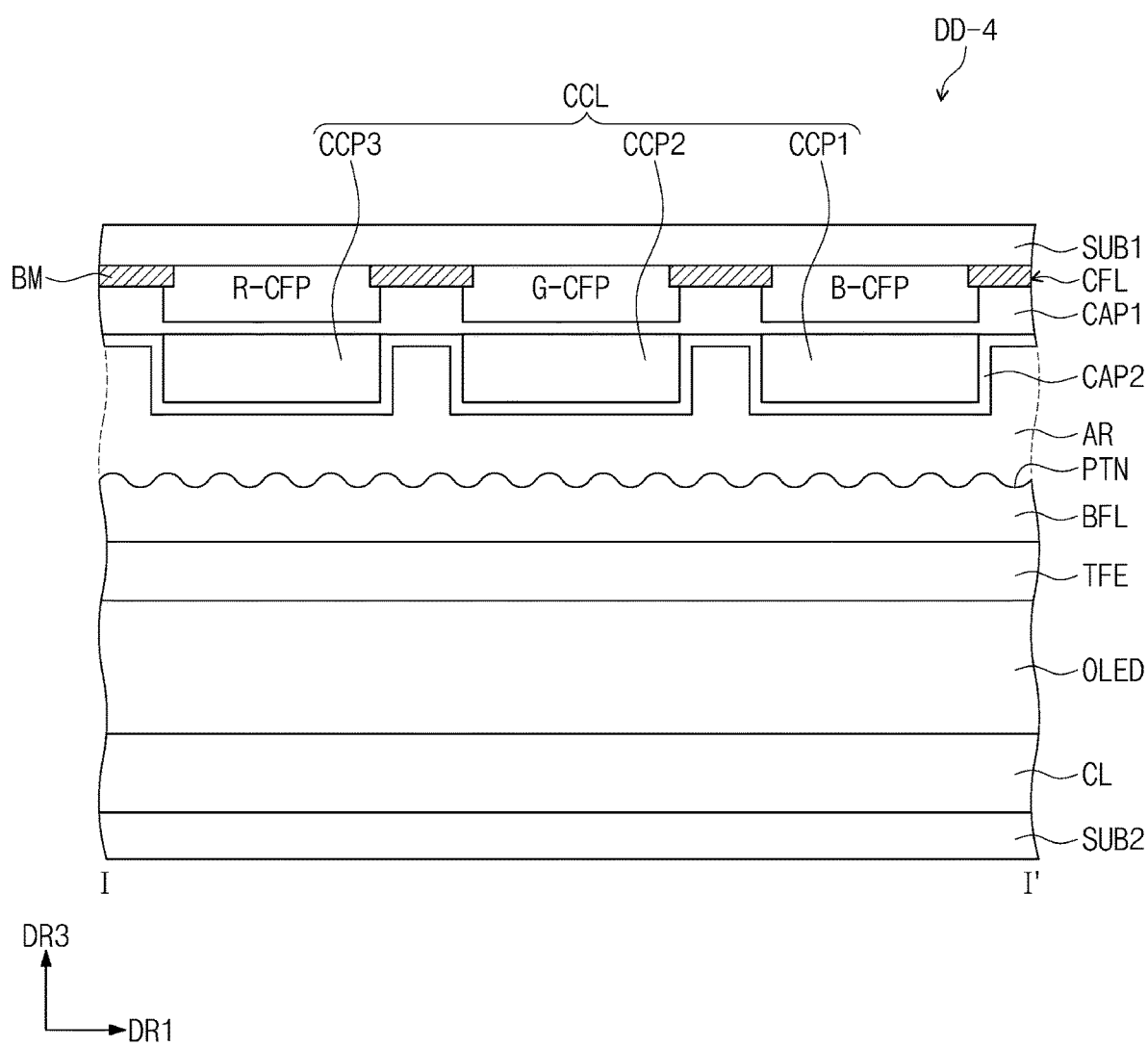
FIG. 12 is a cross-sectional view of a display device according to an embodiment of the present disclosure.
Figure 13:
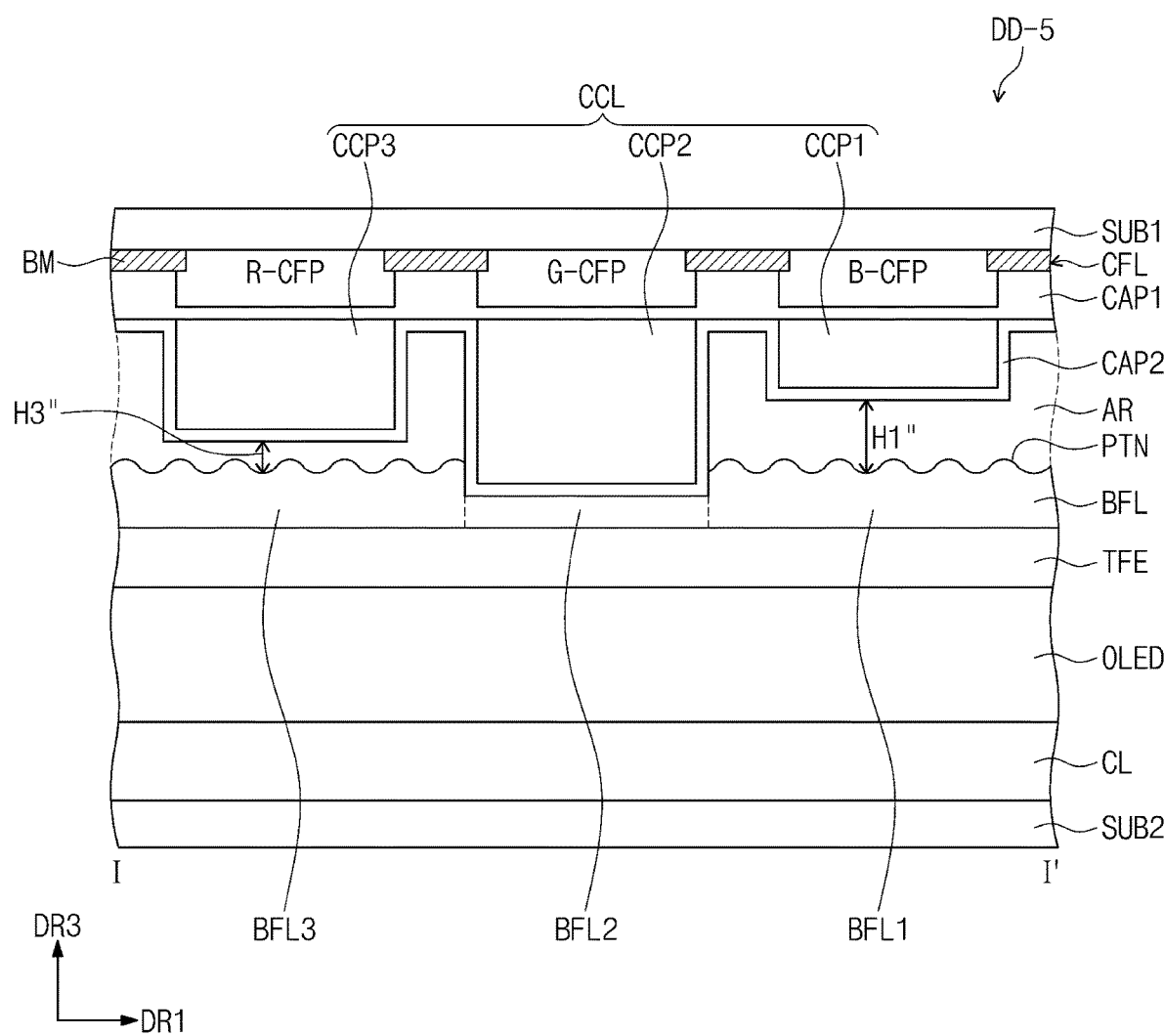
FIG. 13 is a cross-sectional view of a display device according to an embodiment of the present disclosure.
Figure 14:
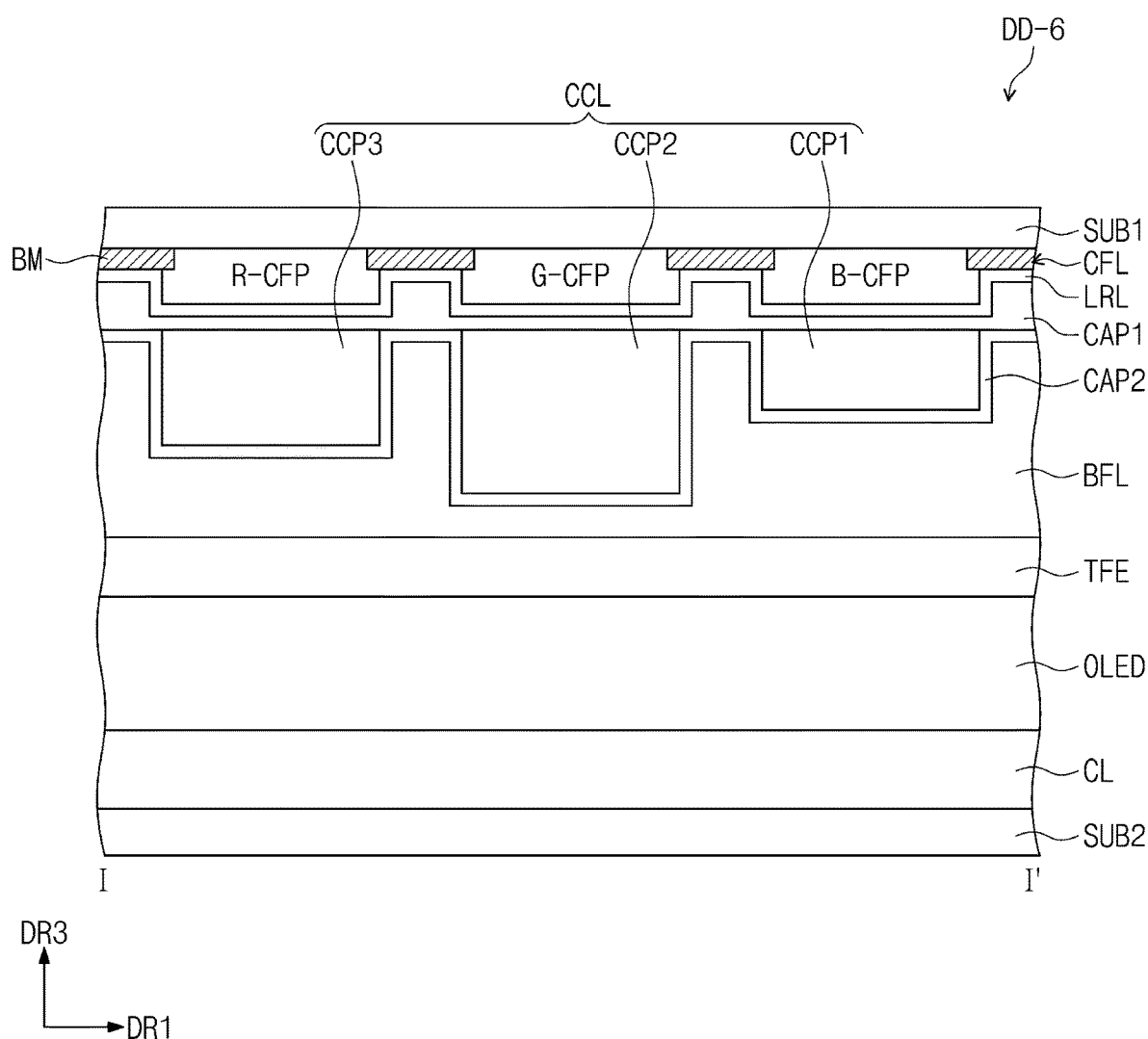
FIG. 14 is a cross-sectional view of the display device according to an embodiment of the present disclosure.

FIG. 11 is a cross-sectional view of a display device DD-3 according to an embodiment of the present disclosure. FIG. 12 is a cross-sectional view of a display device DD-4 according to an embodiment of the present disclosure. FIG. 13 is a cross-sectional view of a display device DD-5 according to an embodiment of the present disclosure. FIG. 14 is a cross-sectional view of a display device DD-6 according to an embodiment of the present disclosure.

In FIGS. 11-14, the organic light emitting diode OLED and the encapsulation member TFE are schematically illustrated when compared to FIG. 3. Hereinafter, duplicative descriptions of features already described with reference to FIGS. 1-10 may not be repeated.

Referring to FIG. 11, the display device DD may further include at least one capping layer CAP.

In an embodiment, the capping layer CAP may be between the color conversion layer CCL and the buffer layer BFL and/or between the color conversion layer CCL and the color filter layer CFL. In an embodiment, a first capping layer CAP1 may be on a top surface of the color conversion layer CCL, e.g., between the color conversion layer CCL and the buffer layer BFL, and a second capping layer CAP2 may be between the color conversion layer CCL and the buffer layer BFL. The capping layer CAP may be made of an inorganic material. Here, a kind of inorganic materials is not specifically limited. The capping layer CAP may be arranged to surround the color conversion layer CCL and thereby to protect the color conversion layer CCL.

Referring to FIGS. 12-13, in an embodiment, the buffer layer BFL may include an uneven pattern PTN.

In an embodiment, the buffer layer BFL may have a bottom surface contacting the encapsulation member TFE and a top surface adjacent to the color conversion layer CCL, the top surface having the uneven pattern PTN. The uneven pattern PTN of the buffer layer BFL may prevent or reduce total reflectance of incident light to thereby improve the light extraction efficiency.

The uneven pattern PTN is not specifically limited in shape or size. Thus, the uneven pattern PTN may have a shape or size that varies according to a formation method thereof. The method for forming the uneven pattern PTN is not specifically limited. For example, a nanoparticle for forming an unevenness may be provided on the top surface of the buffer layer BFL, or the buffer layer BFL may be etched to form the uneven pattern PTN.

The internal space AR may be defined between the top surface of the buffer layer BFL, on which the uneven pattern PTN is formed, and the color conversion layer CCL. The internal space AR may be in a vacuum state, but is not limited thereto.

FIG. 13 illustrates a display device in which the first to third conversion parts CCP1, CCP2, and CCP3 have thicknesses different from each other. For example, as illustrated in FIG. 8, the thickness H2' of the second color conversion part CCP2 may be greater than each of the thickness H1' of the first color conversion part CCP1 and the thickness H3' of the third color conversion part CCP3, and the thickness H3' of the third color conversion part CCP3 may be greater than the thickness H1' of the first color conversion part CCP1.

In an embodiment, the top surface of the buffer layer BFL, on which the uneven pattern PTN is formed, may contact at least one of the second conversion part CCP2 or the third conversion part CCP3. Referring to FIG. 13, the second conversion part CCP2 may have a thickness greater than that of each of the first and third color conversion parts CCP1 and CCP3 and contact a top surface of a second buffer layer BFL2, and the uneven pattern PTN may not be formed on the second conversion part CCP2.

An internal space AR having a height H1″ may be defined between the first color conversion part CCP1 and a top surface of a first buffer layer BFL1 on which the uneven pattern PTN is formed. Also, an internal space AR having a height H3″ may be defined between the third color conversion part CCP1 and a top surface of a third buffer layer BFL3 on which the uneven pattern PTN is formed. In an embodiment, the third light conversion part CCP3 may have a thickness greater than that of the first color conversion part CCP1, and the height H3″ from the uneven pattern PTN to the third color conversion part CCP2 may be less than the height H1″.

Referring to FIG. 14, the display device DD may further include a low-refractive index layer LRL. In an embodiment, the low-refractive index layer LRL may be between the color conversion layer CCL and the color filter layer CFL. The low-refractive index layer LRL may totally reflect light leaking from the color conversion layer CCL due to low refraction according to Snell's law to improve light efficiency through recycling of the light.

The display device according to the embodiment may include the buffer layer to minimize or reduce damage to the color conversion layer.

The display device according to embodiments of the present disclosure may include the buffer layer of which the refractive index is controlled to improve the light extraction efficiency.

As used herein, the terms "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

It will be apparent to those skilled in the art that various modifications and variations can be made to the subject matter of the present disclosure. Thus, it is intended that the present disclosure covers the modifications and variations of the disclosed subject matter provided that they come within the scope of the appended claims and their equivalents.

Hence, the protective scope of the present disclosure shall be determined by the technical scope of the accompanying claims, and equivalents thereof.

What is claimed is:

1. A display device comprising:
   a display element configured to generate a first color light;
   an encapsulation member on the display element and comprising an inorganic layer at an outermost portion thereof;
   a color conversion layer on the encapsulation member and comprising a second color conversion part configured to convert the first color light into a second color light, and a third color conversion part configured to convert the first color light into a third color light; and
   a buffer layer between the encapsulation member and the color conversion layer, wherein a difference in refractive index between the buffer layer and the inorganic layer is about 0.5 or less,
   wherein the buffer layer contacts the encapsulation,
   wherein the buffer layer comprises:
   a bottom surface contacting the encapsulation member; and
   a top surface adjacent to the color conversion layer and comprising an uneven pattern.

2. The display device of claim 1, wherein an internal space in a vacuum state is defined between the buffer layer and the color conversion layer.

3. The display device of claim 1, wherein the buffer layer contacts at least one of the second color conversion part or the third color conversion part.

4. A display device comprising:
   a display element;
   a color conversion layer on the display element and comprising a second color conversion part and third color conversion parts each of which comprises a quantum dot and that are located to be spaced apart from each other;
   an encapsulation member between the display element and the color conversion layer comprising an inorganic layer;
   a buffer layer between the encapsulation member and the color conversion layer, the buffer layer having a refractive index of 1.5 to 2.0;
   a first capping layer on a top surface of the color conversion layer; and
   a second capping layer between the buffer layer and the color conversion layer,
   wherein the first capping layer is formed of an inorganic material.

5. The display device of claim 4, wherein the color conversion layer further comprises a first color conversion part configured to transmit the first color light, and
   wherein the second color conversion part has a thickness greater than each of those of the first color conversion part and the third color conversion part, and the third color conversion part has a thickness greater than that of the first color conversion part in a plane.

6. The display device of claim 4, wherein the color conversion layer further comprises a first color conversion part configured to transmit the first color light, and
   wherein the second color conversion part has an area greater than each of those of the first color conversion part and the third color conversion part, and the third color conversion part has an area greater than that of the first conversion part in a plane.

7. The display device of claim 4, wherein a difference in refractive index between the buffer layer and the inorganic layer is 0.5 or less.

8. The display device of claim 4, wherein the buffer layer comprises:

a bottom surface contacting the encapsulation member; and a top surface adjacent to the color conversion layer and comprising an uneven pattern, wherein an internal space in a vacuum state is defined between the buffer layer and the color conversion layer.

9. The display device of claim 8, wherein the color conversion layer further comprises a first color conversion part configured to transmit the first color light, and wherein the internal space is defined between each of the buffer layer and the first color conversion part and between the buffer layer and the third color conversion part.

\* \* \* \* \*